United States Patent
Park

(10) Patent No.: US 8,222,685 B2
(45) Date of Patent: Jul. 17, 2012

(54) FLASH MEMORY DEVICE AND METHOD FOR MANUFACTURING THE SAME

(75) Inventor: Sung Kun Park, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 257 days.

(21) Appl. No.: 12/640,691

(22) Filed: Dec. 17, 2009

(65) Prior Publication Data

US 2010/0163954 A1   Jul. 1, 2010

(30) Foreign Application Priority Data

Dec. 31, 2008   (KR) .................. 10-2008-0138872

(51) Int. Cl.
*H01L 29/788* (2006.01)

(52) U.S. Cl. ..... 257/315; 257/324; 257/390; 257/E29.3; 257/E29.309; 257/E21.423; 438/257; 438/262

(58) Field of Classification Search .................. 257/315, 257/324, 390, E29.3, E29.309, E21.423; 438/257, 262

See application file for complete search history.

(56) References Cited

U.S. PATENT DOCUMENTS

| 2001/0033513 A1* | 10/2001 | Sung et al. ............... 365/185.18 |
| 2007/0132001 A1* | 6/2007 | Wang et al. .................. 257/315 |

* cited by examiner

*Primary Examiner* — Tu-Tu Ho
(74) *Attorney, Agent, or Firm* — Saliwanchik, Lloyd & Eisenschenk

(57) ABSTRACT

Disclosed are a dual bit type NROM flash memory device and a method for manufacturing the same using a self-aligned scheme. The flash memory device includes a plurality of bit lines buried in a substrate in one direction while being spaced apart from each other at a regular interval; floating gates aligned at both sides of each of the bit lines on the substrate; and a plurality of word lines spaced apart from each other at a regular interval while crossing the bit lines. In the flash memory device of an embodiment, polysilicon is used for a trapping layer, so the programming and erasing operations can be performed at a higher speed, a threshold voltage (Vt) window is widened, and retention characteristics are improved.

20 Claims, 5 Drawing Sheets

FLASH MEMORY DEVICE AND METHOD FOR MANUFACTURING THE SAME

CROSS-REFERENCE TO RELATED APPLICATION

This application claims the benefit under 35 U.S.C. §119 of Korean Patent Application No. 10-2008-0138872, filed Dec. 31, 2008, which is hereby incorporated by reference in its entirety.

BACKGROUND

In general, a nonvolatile memory such as a flash memory does not lose data stored therein even if power is turned off Therefore, the flash memory has been extensively used for a Bios of a personal computer (PC), a set-top box, a printer, and a network server in order to store data. Recently, the flash memory is prevalent in digital cameras, and portable phones.

The flash memory is an EEPROM capable of performing erasing and programming operations in a block unit other than a byte unit. The typical flash memory includes a memory array having a plurality of memory cells. Each memory cell includes a floating gate field effect transistor (FET) capable of retaining charges. Data in the cell are determined depending on the charges in the floating gate. The cell is divided into sections typically called "erase blocks". The memory cells of the flash memory array are typically arranged in the form of "NOR" architecture (each cell is directly connected to a bit line) or "NAND" architecture (cells are prepared as "strings" of cells so that each cell is indirectly connected to a bit line and other cells of a string must be activated for the purpose of access). Each cell of the erase block can be electrically programmable in a random basis by charging the floating gate. The charge can be erased from the floating gate through the block erase operation and all floating gate memory cells in an erase block can be erased at one time.

Recently, an NROM (nitride read only memory) is extensively used as a flash memory. The NROM has some characteristics of the flash memory without requiring complicated manufacturing processes for the flash memory. NROM integrated circuits can be realized through a standard CMOS process. Due to the intrinsic device characteristics of the memory, some NROM memory cells can store a plurality of data bits (for instance, 2 bits in each cell).

FIG. 1 is a cross-sectional view showing a planar type NROM flash memory device.

Referring to FIG. 1, an NROM device includes a semiconductor substrate 10 formed with source and drain regions 11 and 13. An ONO pattern 16 including an oxide layer 16c, a nitride layer 16b and an oxide layer 16a are formed between the source and drain regions 11 and 13, and a control gate 15 is formed on the ONO pattern 16. The nitride layer 16b of the ONO pattern 16 may serve as a trapping layer 19 for trapping charges from a channel.

The NROM memory cell has a structure similar to a structure of a MOSFET transistor, so the gate 15 is isolated from the channel, the source, and the drain by the ONO pattern 16. An isolated trapping layer is buried in the ONO pattern 16. Current may flow when the NROM memory cell/transistor is selected or activated. The charges trapped in the trapping layer exert an influence upon the quantity of current depending on the operational direction (current flow in the channel) of the NROM transistor, thereby effectively increasing or decreasing the threshold value of current in the operational direction of the NROM transistor.

According to the operation of the conventional NROM device, when the NROM device is programmed through an HCI (hot carrier injection) scheme and erased through a BTBT (band to band tunneling) hot hole scheme, holes and electrons are stacked in areas different from each other due to difference in distribution between electrons and holes.

Due to the above difference in distribution, the trapped charges may be subject to lateral diffusion so that the retention threshold voltage (Vt) characteristics may be degraded. As several periods repeat, the program Vt is gradually increased and the erase Vt is gradually reduced, so that the Vt window becomes gradually narrowed.

That is, in the typical NROM flash memory device, the position of the charges may not be changed after the charges have been trapped in the trap layer, so the device characteristics may be changed and reliability may deteriorate even if the trap positions of the electrons and the holes are slightly changed.

BRIEF SUMMARY

An embodiment provides a dual-bit type NROM flash memory device manufactured through a self-align scheme and a method for manufacturing the same.

An embodiment provides an NROM flash memory device and a method for manufacturing the same, in which polysilicon is used for a trapping layer, so that programming and erasing operations can be performed at a higher speed, a threshold voltage (Vt) window can be widened, and retention characteristics can be improved.

A flash memory device according to an embodiment includes a plurality of bit lines buried in a substrate in one direction while being spaced apart from each other at a regular interval, floating gates aligned at both sides of the bit lines on the substrate, and a plurality of word lines spaced apart from each other at a regular interval while crossing the bit lines.

A method for manufacturing the flash memory device according to an embodiment includes forming self-aligned floating gates on a substrate, forming bit lines by implanting impurities between the floating gates, and forming word lines that cross the bit lines. A method for manufacturing the flash memory device according to an embodiment includes forming a nitride layer pattern on a silicon substrate; forming a tunneling oxide layer by oxidizing the silicon substrate having the nitride layer pattern thereon; forming floating gates at sidewalls of the nitride layer pattern while being on the tunneling oxide layer; removing the nitride layer pattern from between the floating gates; forming bit lines by implanting impurities onto the silicon substrate where the nitride layer pattern has been removed; forming an ONO layer over an entire surface of the silicon substrate having the floating gates and the bit lines; and forming a plurality of word lines on the ONO layer such that the word lines cross the bit lines while being spaced apart from each other at a regular interval.

DETAILED DESCRIPTION

Hereinafter, a flash memory device and a method for manufacturing the same according to an embodiment will be described in detail with reference to accompanying drawings.

In the description of embodiments, it will be understood that, when a layer is referred to as being "on" or "under" another layer, it can be directly or indirectly on or under the other layer.

Embodiments of the present invention relate to an NROM device employing multi-bits in a flash memory device.

FIGS. 2 to 11 are cross-sectional views showing the procedure for manufacturing the flash memory device according to an embodiment.

Figure 1:
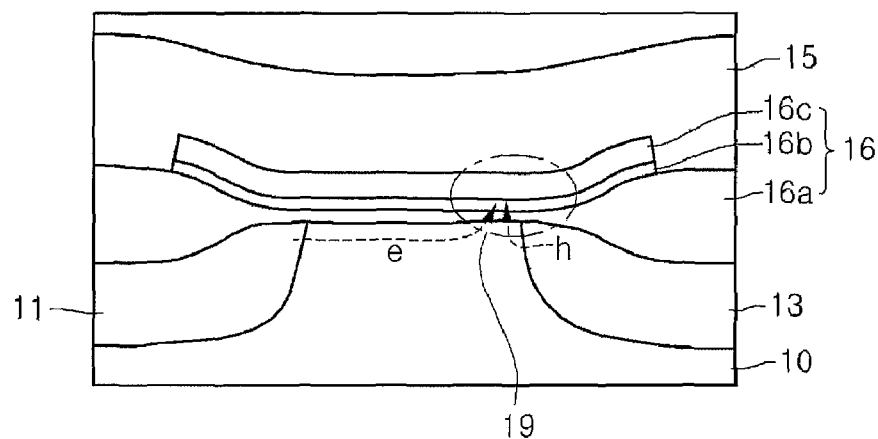
FIG. 1 is a cross-sectional view showing a planar type NROM flash memory device.
Figure 2:
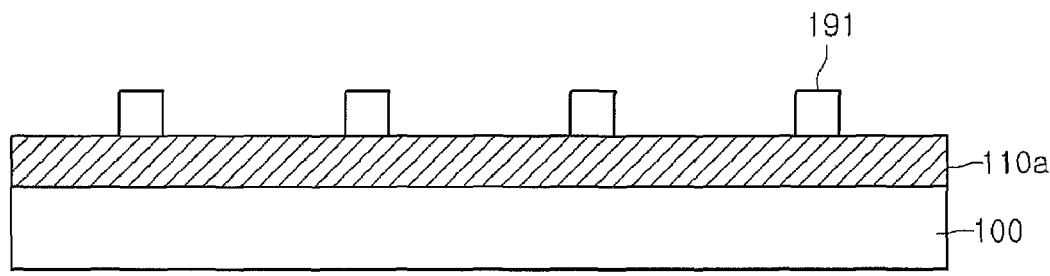
FIGS. 2 to 11 are cross-sectional views showing a procedure for manufacturing a flash memory device according to an embodiment.

Referring to FIG. 2, a nitride layer 110a is formed on a silicon substrate 100.

The nitride layer 110a may serve as a fence when forming a floating gate later.

The nitride layer 110a can be formed through a CVD (chemical vapor deposition) scheme.

Then, a first photoresist pattern 191 is formed on the nitride layer 110a.

Figure 3:
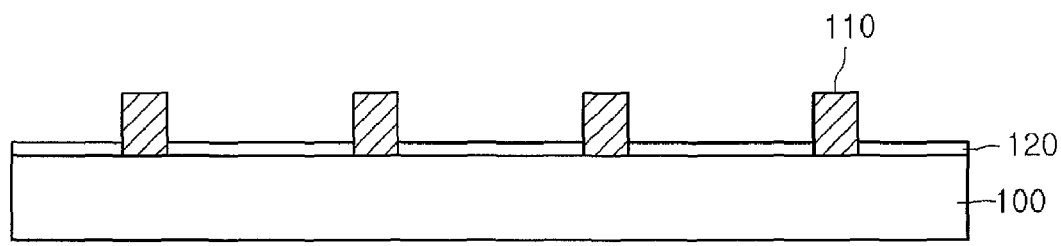

As shown in FIG. 3, the nitride layer 110a is etched by using the first photoresist pattern 191 as a mask, thereby forming a nitride layer pattern 110.

Height of the floating gate, which will be formed later, is determined according to the height of the nitride layer pattern 110. Therefore, the thickness of the nitride layer 110a can be selected accordingly.

After forming the nitride layer pattern 110, a tunnel oxide layer 120 is formed on the silicon substrate 100.

The tunnel oxide layer 120 can be formed through one of a wet oxidation scheme and a dry oxidation scheme.

Since oxidation does not occur in a region where the nitride layer pattern 110 is formed, the tunnel oxide layer 120 may not be formed on that region. Thus, the tunnel oxide layer 120 is formed over the whole area of the silicon substrate 100 except for the region where the nitride layer pattern 110 is formed.

Figure 4:
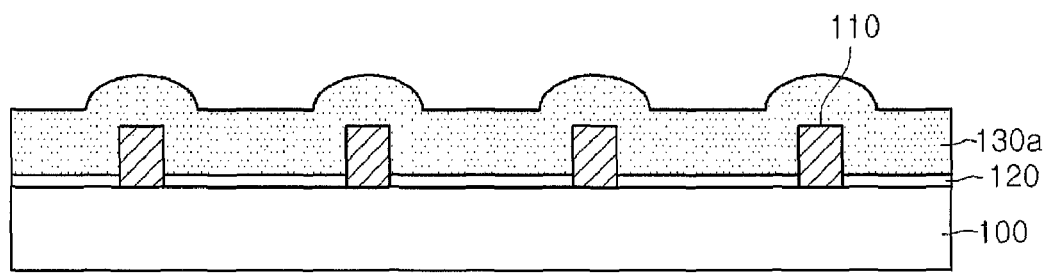

Referring to FIG. 4, a first polysilicon layer 130a is formed over the entire silicon substrate 100 having the nitride layer pattern 110 and the tunnel oxide layer 120.

In order to ensure quality of the tunnel oxide layer 120, a time delay may be presented after the tunnel oxide layer 120 has been formed.

Figure 5:
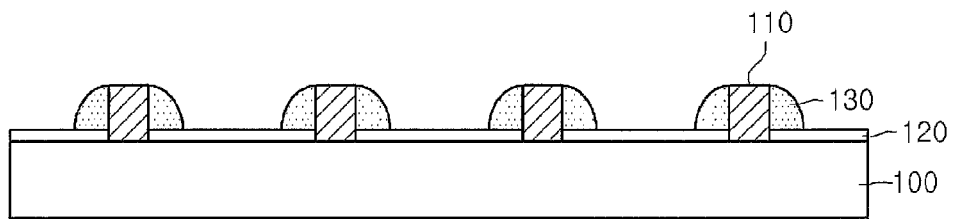

After that, as shown in FIG. 5, a floating gate 130 is formed at the sidewalls of the nitride layer pattern 110 in the form of a spacer by etching back the first polysilicon layer 130a.

The floating gate 130 is uniformly formed on the sidewalls of the nitride wall pattern 110 in a self-align scheme by performing an anisotropic etch back process without a photo process.

Therefore, the floating gate 130 formed through the self-align scheme has uniform length, so that a uniform reading characteristic can be ensured when a reverse reading is performed to use multi-bits.

The memory device according to an embodiment is manufactured through the self-align scheme, so that the manufacturing process can be simplified and uniform device characteristics can be ensured, thereby improving the reliability of the memory device.

The memory device according to an embodiment employs polysilicon to form the trapping layer, so that programming and erasing operations can be performed at a high speed, the Vt window can be widened, and the retention characteristics can be improved.

In addition, according to the memory device of an embodiment, polysilicon is used to form the trapping layer, so that injected electrons or holes can be uniformly distributed. Thus, the position of the trap site is not important, so the retention caused by lateral diffusion may not occur, thereby improving the device characteristics.

Figure 6:
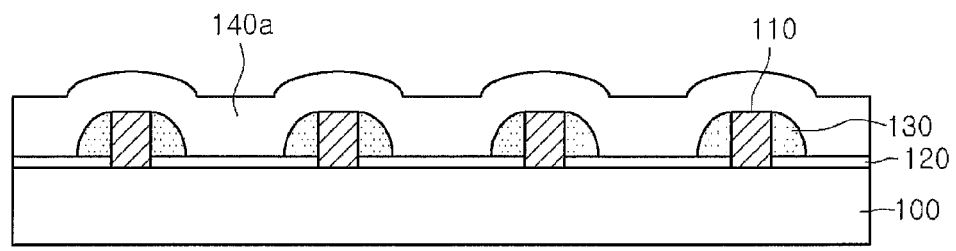

Referring to FIG. 6, a protective layer 140a is formed over the whole area of the silicon substrate 100 having the floating gate 130.

The protective layer 140a may include TEOS.

The protective layer 140a may serve as a masking layer to form a B/N line (buried N+ line).

The B/N line can be formed on an area where the nitride layer pattern is actually formed by implanting ions through a self-align scheme. In addition, according to an embodiment, the B/N line can be formed by using the protective layer to assist the masking function.

Figure 7:
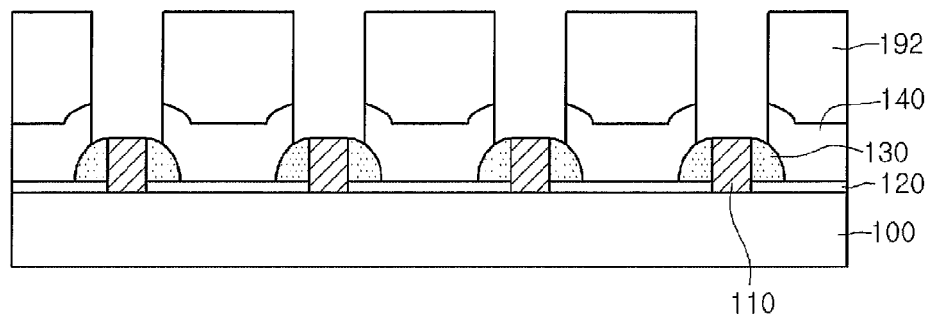

As shown in FIG. 7, a second photoresist pattern 192 is formed on the protective layer 140a, and the protective layer 140a is selectively etched by using the second photoresist pattern 192 as a mask, thereby forming a protective layer pattern 140.

The protective layer pattern 140 exposes the nitride layer pattern 110.

The protective layer pattern 140 may expose a part of a top surface of the floating gate 130 adjacent to the nitride layer pattern 110.

Since there is etching selectivity between the polysilicon of the floating gate and the TEOS of the protective layer, the protective layer is selectively etched and surfaces of the floating gate and the nitride layer pattern are exposed without being etched.

Then, the second photoresist pattern 192 is removed.

Figure 8:
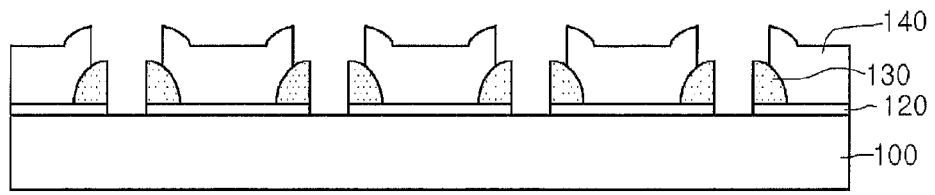

Referring to FIG. 8, the exposed nitride layer pattern 110 is removed by using the protective layer pattern 140 as an etch mask.

The nitride layer pattern 110 can be removed by performing a wet etching process using $H_3PO_4$ as an etching solution.

The etching solution is selected so as to not exert an influence upon the polysilicon of the floating gate and the TEOS of the protective layer. Therefore, the nitride layer pattern 110 can be selectively removed to expose the silicon substrate 100 below the nitride layer pattern 110.

Figure 9:
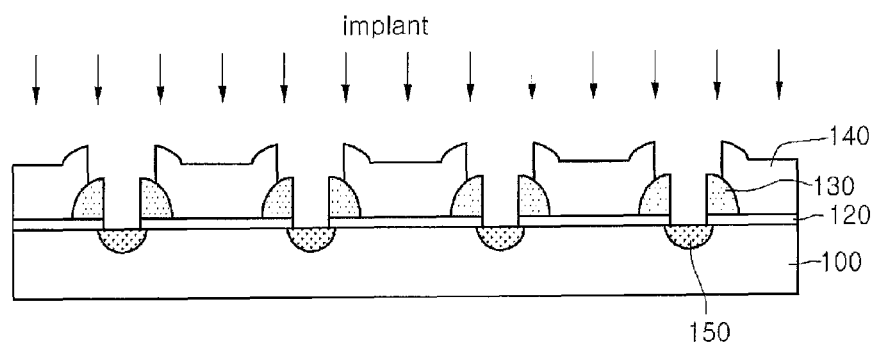
Figure 10:
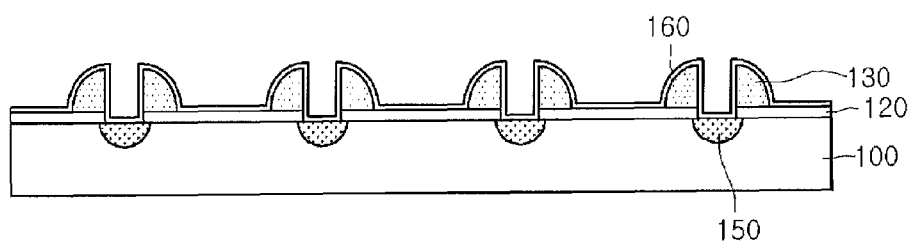

Then, as shown in FIG. 9, n-type impurities at high concentration are implanted into the silicon substrate 100 to a predetermined depth by using the protective layer pattern 140 as an ion implantation mask, thereby forming the B/N line. For example, arsenic (As) ions at a dose of $1 \times 10^{15}$ cm$^{-2}$ or above can be implanted. Then, as shown in FIG. 10, the protective layer pattern 140 is removed, and an ONO layer 160 is formed over the whole area of the silicon substrate 100.

Thus, the ONO layer 160 can be formed over the floating gate 130, the tunneling oxide layer 120, and the B/N line 150.

The ONO layer 160 has a structure in which an oxide layer, a nitride layer, and an oxide layer are sequentially stacked. The oxide layer, the first nitride layer, and the second oxide layer may each have a thickness of about 50 to 100 Å.

The first oxide layer of the ONO layer 160 can be deposited through CVD or can be formed through a thermal oxidation scheme. If the first oxide layer is formed through the thermal oxidation scheme, diffusion and activation of an ion implantation region of the B/N line, which has been formed in the previous process, can be achieved.

The B/N line is diffused to the extent that the B/N line may overlap with the floating gate to facilitate the programming operation through the HCI scheme and the erasing operation through the BTBT scheme. In this regard, the thermal oxidation and the CVD schemes are selectively performed to ensure the optimal overlap between the B/N line and the floating gate, thereby achieving desired lateral diffusion.

For instance, in order to minimize the lateral diffusion, the CVD scheme is preferably employed. In contrast, in order to maximize the lateral diffusion, the thermal oxidation scheme is preferably employed.

In addition, if the ONO layer 160 is partially formed through the thermal oxidation scheme, oxidation may proceed at a relatively higher speed on the B/N line as compared with other portions, so that the ONO layer 160 may serve as an etch stop layer for the B/N line when the control gate is formed in the subsequent process.

Figure 11:
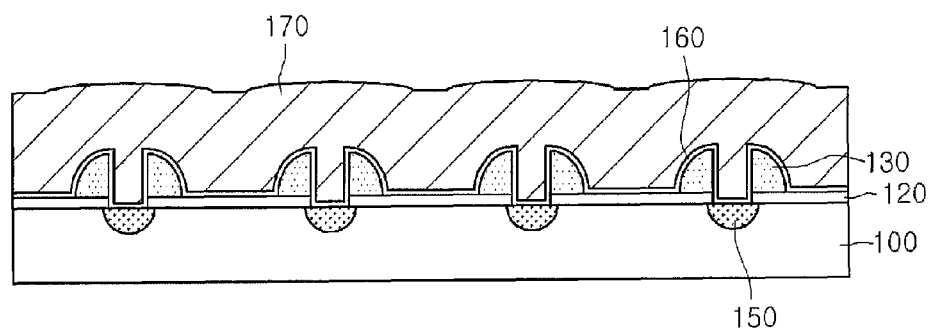
Figure 13:
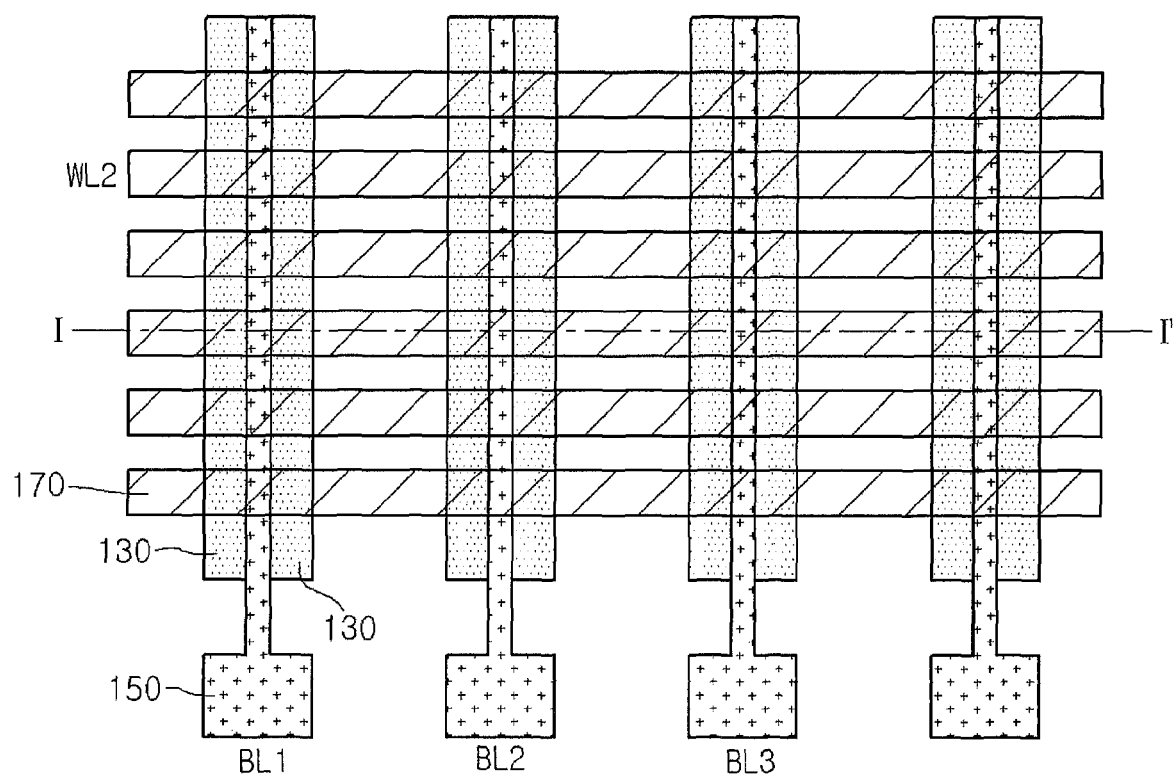
FIG. 13 is a plan view showing a part of a flash memory device according to an embodiment.

As shown in FIG. 11, after the ONO layer 160 has been formed, a second polysilicon layer is formed over the whole area of the silicon substrate 100 and patterned to form a control gate 170 (see also FIG. 13).

The control gate 170 crosses the B/N line and includes a plurality of polysilicon patterns spaced apart from each other by a predetermined interval.

When the second polysilicon layer is selectively etched, the ONO layer aligned at a lower portion of the second polysilicon layer may be simultaneously removed.

Figure 12:
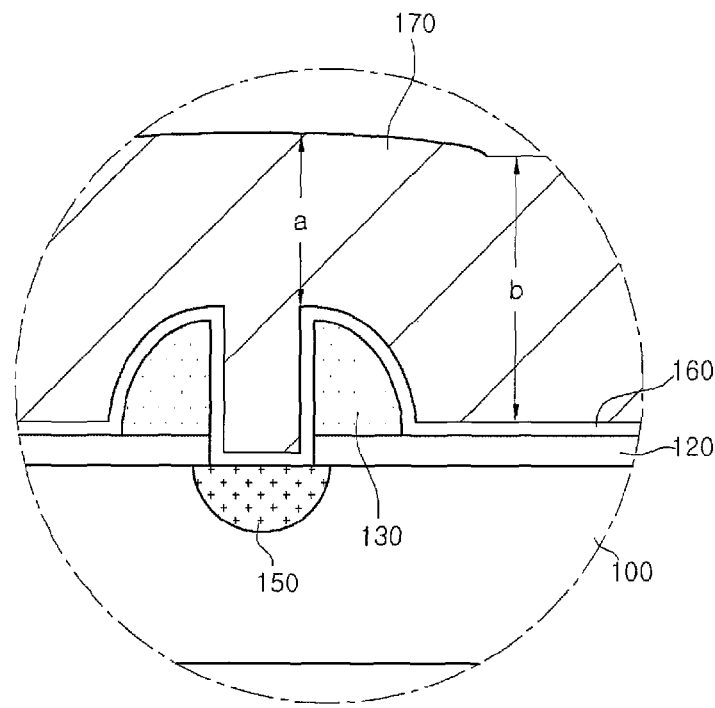
FIG. 12 is an enlarged view of a part shown in FIG. 11.

FIG. 12 is an enlarged cross-sectional view of a part shown in FIG. 11.

As shown in FIG. 12, the difference between thickness a of the second polysilicon layer deposited on the floating gate 130 and thickness b of the second polysilicon layer deposited on the silicon substrate 100 may be reduced as the interval between the B/N lines 150 becomes narrowed when the control gate 170 is formed by selectively etching the second polysilicon layer. In other words, the gap fill characteristic of the second polysilicon layer aligned between the adjacent B/N lines 150 can be improved as the interval between the adjacent B/N lines 150 becomes narrowed.

Thus, when the second polysilicon layer is being etched to form the control gate while employing etchant with reduced etching selectivity between the second polysilicon layer and the ONO layer 160, the second polysilicon layer and the ONO layer 160 formed on the floating gate 130 are simultaneously etched, exposing the floating gate 130. At this time, since the second polysilicon layer formed on the silicon substrate 100 has been gap-filled with sufficient thickness, the lower substrate may not be damaged.

That is, the second polysilicon layer has gap fill characteristics while being deposited, so that the difference between the thickness a and the thickness b may be 80% or greater with respect to the thickness of the floating gate 130.

According to an embodiment, the gap fill characteristic can be improved as the interval between the floating gates 130 becomes narrowed, so the margin for the control gate can be increased as the device is scaled down and highly integrated.

Figure 14:
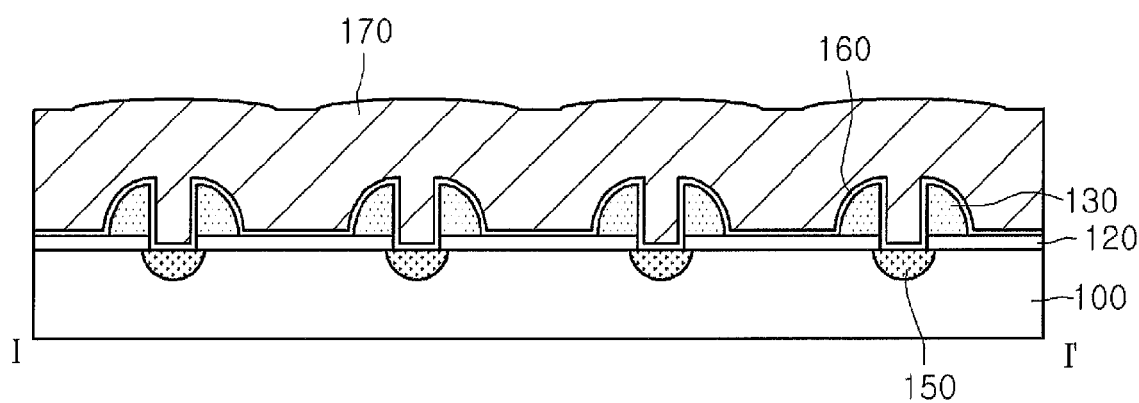
FIG. 14 is a cross-sectional view taken along line I-I' of FIG. 13.

FIG. 13 is a plan view showing a part of the flash memory device according to an embodiment, and FIG. 14 is a cross-sectional view taken along line I-I' of FIG. 13.

As shown in FIGS. 13 and 14, the B/N lines 150 are aligned in one direction while being spaced apart from each other at a regular interval.

Self-aligned floating gates 130 are formed along both sides of the B/N lines.

In addition, the control gates 170 are aligned at a regular interval while crossing the B/N lines 150.

The B/N lines 150 may serve as bit lines and the control gates 170 may serve as word lines.

As an example operation for a 2 bit memory cell in accordance with an embodiment, a second word line WL2 is selected by applying voltage of 9V and a second B/N line BL2 is selected by applying voltage of 9V. Therefore, cells positioned at cross points between the second word line WL2 and the second B/N line BL2 are operated. At this time, the cells positioned at the cross points have two floating gates 130 aligned at both sides of each B/N line 150. Between the left and right cells, the cell subject to the programming operation may be determined depending on the adjacent B/N lines. For example, BL1 and BL3 can be used when BL2 is selected.

When a voltage of 0V is applied to the third B/N line BL3, the right cell at BL2 that is adjacent to the third B/N line is subject to the programming operation.

In order words, since a voltage of 9V is applied to the second word line WL2 and the second B/N line BL2, respectively, and a voltage of 0V is applied to the third B/N line BL3, hot carriers generated from the second B/N line BN2 are trapped in the floating gate 130 of the second B/N line adjacent to the third B/N line due to the bias of the control gate 170.

In this manner, according to the dual-bit type NROM flash memory device, the programming operation of the cell may be realized, or not, based on the voltage applied to both sides of the bit line.

According to the NROM flash memory device of an embodiment, injected electrons or holes can be uniformly distributed in the floating gate, so the trap site is not as important as compared with the related art NROM flash memory device employing the nitride layer as the trapping layer, and the programming and erasing operation can be performed at a higher speed. In addition, the retention caused by the re-distribution occurring in the trapping layer due to lateral diffusion may not occur, and the Vt window may not be narrowed by the difference in distribution regions of the electrons and holes even if several periods have repeated.

According to an embodiment, the dual bit line is formed through a self-align scheme, so that the programming operation by using drain avalanche hot carriers, in which a distance between the B/N line and the floating gate is critical, and the erasing operation by using the BTBT hot hole scheme can be efficiently performed.

According to the self-align scheme, high-concentration flash cells can be achieved and the process margin can be increased, so the manufacturing process can be easily performed in a simple manner.

In addition, since the B/N lines are employed, the flash cell can be operated by using only one metal, and the control gates and the B/N lines can be used as word lines and bit lines, respectively.

Further, when the B/N lines are formed, ion diffusion and activation of the B/N lines can be achieved through the thermal process adopted to form the ONO layer, so the logic compatible characteristics can be ensured without performing an additional thermal process.

In addition, the implantation process is performed by using n-type impurities, such as As ions, to form the B/N lines. Thus, when the ONO layer is formed in the subsequent process, the first oxide layer of the ONO layer can be formed by using a thermally grown oxide layer, so that the oxide layer on the B/N line may be thicker than other portions. Thus, the B/N lines can be protected when the control gate is etched, simplifying the manufacturing process.

Further, the devices can be isolated from each other by the B/N lines without forming an isolation layer on the silicon substrate through a shallow trench isolation (STI) process, thereby reducing the cell size.

In addition, according to an embodiment, the number of contacts can be reduced, so that a NOR type cell array structure having a high speed random access function can be achieved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device comprising:
    a plurality of bit lines buried in a substrate in one direction while being spaced apart from each other at a regular interval;
    floating gates aligned at both sides of each of the bit lines on the substrate; and
    a plurality of word lines spaced apart from each other at a regular interval while crossing the bit lines;
    wherein the floating gates extend along the both sides of each of the bit lines.

2. The flash memory device of claim 1, wherein the bit lines are formed by implanting n-type impurities in the substrate.

3. The flash memory device of claim 1, further comprising:
    a tunneling oxide layer between the floating gates and the substrate, and
    an ONO layer between the floating gates and the word lines.

4. The flash memory device of claim 3, wherein the ONO layer is further disposed on the bit lines.

5. The flash memory device of claim 1, wherein the floating gates and the word lines include polysilicon patterns.

6. The flash memory device of claim 1, wherein the floating gates overlap portions of the bit lines.

7. The flash memory device of claim 1, wherein the floating gates serve as a charge trap layer.

8. A method for manufacturing a flash memory device of claim 1, the method comprising:
    foaming self-aligned floating gates on a substrate;
    forming bit lines by implanting impurities between the floating gates; and
    forming word lines that cross the bit lines;
    wherein the floating gates extend continuously along the both sides of each of the bit lines.

9. The method of claim 8, wherein the forming of the floating gates comprises:
    forming a nitride layer pattern on the substrate;
    forming an oxide layer by oxidizing the substrate exposed by the nitride layer pattern;
    forming a first polysilicon layer on the substrate including the oxide layer and the nitride layer pattern; and
    anisotropically etching an entire surface of the first polysilicon layer.

10. The method of claim 9, wherein the forming of the bit lines comprises:
    forming an oxide layer pattern, which exposes the nitride layer pattern, on the substrate having the floating gates;
    removing the nitride layer pattern by using the oxide layer pattern as a mask;
    implanting n-type impurities into the substrate where the nitride layer pattern has been removed by using the oxide layer pattern as a mask; and
    removing the oxide layer pattern.

11. The method of claim 8, wherein the forming of the word lines comprises:
    forming an ONO layer over a whole surface of the substrate;
    forming a second polysilicon layer on the ONO layer; and
    patterning the second polysilicon layer to form the word lines that cross the floating gates.

12. The method of claim 11, wherein, during the forming of the ONO layer, the bit lines are diffused and activated until portions of the bit lines overlap with the floating gates.

13. The method of claim 11, wherein the ONO layer surrounds upper surfaces of the floating gates and is formed on the bit lines.

14. The method of claim 11, wherein the ONO layer is formed thicker on the bit lines than on the floating gates.

15. The method of claim 11, wherein forming the ONO layer includes sequentially stacking a first oxide layer, a first nitride layer, and a second oxide layer; and wherein the first oxide layer is formed through at least one of a CVD process and a thermal oxidation process.

16. A method for manufacturing a flash memory device of claim 1, the method comprising:
    forming a nitride layer pattern on a silicon substrate;
    forming a tunneling oxide layer by oxidizing the silicon substrate having the nitride layer pattern;
    forming floating gates on the tunneling oxide layer, the floating gates being formed at sidewalls of the nitride layer pattern;
    removing the nitride layer pattern from between floating gates formed at the sidewalls of the nitride layer pattern;
    forming bit lines by implanting impurities onto the silicon substrate where the nitride layer pattern has been removed;
    forming an ONO layer over an entire surface of the silicon substrate having the floating gates and the bit lines; and
    forming a plurality of word lines on the ONO layer such that the word lines cross the bit lines while being spaced apart from each other at a regular interval,
    wherein the floating gates extend continuously along both sides of each of the bit lines.

17. The method of claim 16, wherein the forming of the floating gates comprises:
    forming a first polysilicon layer on the tunneling oxide layer and the nitride layer pattern; and
    anisotropically etching an entire surface of the first polysilicon layer.

18. The method of claim 16, wherein the removing of the nitride layer pattern and the forming of the bit lines comprises:
    forming a mask pattern, which exposes the nitride layer pattern, on the silicon substrate having the floating gates;
    removing the nitride layer pattern by using the mask pattern as an etch mask;
    implanting n-type impurities into the silicon substrate where the nitride layer pattern has been removed by using the mask pattern as an implantation mask; and
    removing the mask pattern.

19. The method of claim 16, wherein, during the forming of the ONO layer, the bit lines are diffused and activated until portions of the bit lines overlap with the floating gates.

20. The flash memory device of claim 1, wherein a height of each floating gate slopes downwardly from its bit line side to a side facing away from the bit line side.

* * * * *